(12) United States Patent
Chatani et al.

(10) Patent No.: US 12,293,893 B2
(45) Date of Patent: May 6, 2025

(54) ELECTRON SOURCE, MANUFACTURING METHOD THEREFOR, AND DEVICE COMPRISING ELECTRON SOURCE

(71) Applicants: Denka Company Limited, Tokyo (JP); NATIONAL INSTITUTE FOR MATERIALS SCIENCE, Tsukuba (JP)

(72) Inventors: Hiromitsu Chatani, Tokyo (JP); Daisuke Ishikawa, Tokyo (JP); Jie Tang, Ibaraki (JP); Tadakatsu Ohkubo, Ibaraki (JP); Shuai Tang, Ibaraki (JP); Jun Uzuhashi, Ibaraki (JP); Kazuhiro Hono, Ibaraki (JP)

(73) Assignees: Denka Company Limited, Tokyo (JP); NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 18/294,251

(22) PCT Filed: Jun. 23, 2022

(86) PCT No.: PCT/JP2022/025183
§ 371 (c)(1),
(2) Date: Feb. 1, 2024

(87) PCT Pub. No.: WO2023/013282
PCT Pub. Date: Feb. 9, 2023

(65) Prior Publication Data
US 2024/0347306 A1  Oct. 17, 2024

(30) Foreign Application Priority Data
Aug. 5, 2021 (JP) ................................ 2021-129281

(51) Int. Cl.
*H01J 1/02* (2006.01)
*H01J 9/02* (2006.01)
*H01J 37/06* (2006.01)

(52) U.S. Cl.
CPC . *H01J 1/02* (2013.01); *H01J 9/02* (2013.01)

(58) Field of Classification Search
CPC .................. H01J 1/02; H01J 9/02; H01J 37/06
See application file for complete search history.

(56) References Cited

U.S. PATENT DOCUMENTS 5,763,880 A * 6/1998 Nisiyama .............. H01J 37/073
250/423 F
5,993,281 A  11/1999 Musket
(Continued)

FOREIGN PATENT DOCUMENTS

JP  3547531  *  7/2004
JP  2009-146705 A  7/2009
(Continued)

OTHER PUBLICATIONS

Kleshch, V.I. et al., "Field Emission from Diamond Needles Produced by CVD Growth", Technical Digest, 2015, 28th International Vacuum Nanoelectronics Conference, Aug. 27, 2015, p. 172-p. 173.
(Continued)

*Primary Examiner* — Joseph L Williams
(74) *Attorney, Agent, or Firm* — Leydig, Voit & Mayer, Ltd.

(57) ABSTRACT

A manufacturing method for an electron source according to the present disclosure includes steps of: (A) cutting out a chip from a block of an electron emission material, (B) fixing a first end portion of the chip to a distal end of a support needle, and (C) sharpening a second end portion of the chip. The step (A) includes forming first and second grooves which constitute first and second surfaces of the (Continued)

chip in the block by irradiating a surface of the block with an ion beam. The first end portion of the chip includes the first surface and the second surface with the surfaces forming an angle α of 10 to 90°. The step (B) includes forming a joint between the distal end of the support needle and the first end portion of the chip.

9 Claims, 11 Drawing Sheets

(56) References Cited

U.S. PATENT DOCUMENTS

| 11,915,920 | B2* | 2/2024 | Tang | ............ H01J 9/025 |
|---|---|---|---|---|
| 2004/0104682 | A1 | 6/2004 | Horsky et al. | |
| 2006/0238133 | A1 | 10/2006 | Horsky et al. | |
| 2007/0176114 | A1 | 8/2007 | Horsky et al. | |
| 2007/0176115 | A1 | 8/2007 | Horsky et al. | |
| 2019/0066966 | A1 | 2/2019 | Kusunoki et al. | |
| 2022/0406552 | A1 | 12/2022 | Tang et al. | |

FOREIGN PATENT DOCUMENTS

| JP | 2016-207319 A | | 12/2016 |
|---|---|---|---|
| JP | 2017-157368 | * | 9/2017 |
| TW | 511113 B | | 11/2002 |
| WO | WO 2021/079855 A1 | | 4/2021 |

OTHER PUBLICATIONS

The International Bureau of WIPO, International Preliminary Report on Patentability in International Application No. PCT/JP2022/025183 (Feb. 15, 2024).

European Patent Office, Extended European Search Report issued in European Application No. 22852708.1 (Oct. 31, 2024).

\* cited by examiner (a)

(b)

(c)

(a)

(b)

(a)

(b)

(a)

(b)

ELECTRON SOURCE, MANUFACTURING METHOD THEREFOR, AND DEVICE COMPRISING ELECTRON SOURCE

CROSS-REFERENCE TO RELATED APPLICATIONS

This application is a 35 U.S.C. § 371 national phase application of PCT/JP2022/025183, filed on Jun. 23, 2022, which claims priority to Japanese Patent Application No. 2021-129281, filed on Aug. 5, 2021.

TECHNICAL FIELD

The present disclosure relates to an electron source, a manufacturing method thereof, and a device comprising the electron source.

BACKGROUND ART

Electron sources are used, for example, in electron microscopes and semiconductor inspection apparatuses. The electron source includes a chip made of an electron-emitting material. For example, in a chip of a thermal field emission type electron source, a distal end thereof is sharpened, and thus more electrons can be emitted due to an electric field concentration effect. Patent Literature 1 discloses the use of an ion beam to sharpen a distal end of a chip.

CITATION LIST

Patent Literature

[Patent Literature 1] U.S. Pat. No. 5,993,281

SUMMARY OF INVENTION

Technical Problem

In recent years, there has been a demand for further miniaturization of the chips included in the electron sources. The present disclosure provides a method that can efficiently manufacture fine electron sources. Further, the present disclosure provides an electron source that can meet the demand for miniaturization and a device including the same.

Solution to Problem

A method for manufacturing an electron source according to one aspect of the present disclosure includes steps of:
(A) cutting out a chip of an electron emitting material from a block of the electron emitting material;
(B) fixing a first end portion of the chip to a distal end of a support needle; and
(C) sharpening a second end portion of the chip fixed to the distal end.
The step (A) includes
(a1) forming a first groove constituting a first surface of the chip in the block by irradiating a surface of the block with an ion beam, and
(a2) forming a second groove constituting a second surface of the chip in the block by irradiating the surface of the block with an ion beam.
The first end portion of the chip has the first surface and the second surface forming an angle of 10 to 90°.

The step (B) includes forming a joint between the distal end of the support needle and the first end portion of the chip.

According to the manufacturing method, in the step (A), the chip which is very fine and has a predetermined shape can be efficiently cut out from the block using an ion beam. Further, in the step (B), since the first end portion of the chip is bonded to the distal end of the support needle, and the first end portion includes the first surface and the second surface, a sufficient area for the joint can be secured. Thus, separation of the chip from the support needle can be sufficiently curbed.

An electron source according to one aspect of the present disclosure includes a support needle having a distal end, a chip of an electron emitting material having first and second end portions, and a joint configured to fix the first end portion of the chip to the distal end of the support needle, wherein the first end portion of the chip has a first surface and a second surface which form an angle of 10 to 90°.

According to the electron source, the distal end of the support needle and the first end portion of the chip are bonded, and the first end portion has the first surface and the second surface. Therefore, a sufficient area of the joint can be secured. Thus, separation of the chip from the support needle can be sufficiently curbed.

In the electron surface, the first end portion of the chip may be in contact with the distal end of the support needle, the distal end of the support needle and the first end portion of the chip may be spaced apart, and a material constituting a joint may be interposed therebetween. Preferably, a width Wa of the distal end of the support needle and a width Wb of the first end portion of the chip satisfy one of Condition 1 and Condition 2 expressed by the following inequalities.

$$1 \le Wa/Wb \le 10000 \quad \text{(Condition 1)}$$

$$1 \le Wb/Wa \le 10000 \quad \text{(Condition 2)}$$

The electron source may be very fine. The width of the distal end of the support needle is 0.5 to 10 μm. The width of the first end portion of the chip is 0.5 μm or less. From the viewpoint of stable electron emission over a long period of time, an angle of the second end portion of the chip of the electron emitting material is, for example, 5 to 90° in a longitudinal section.

A device according to one aspect of the present disclosure includes the electron source. Examples of the device including the electron source include electron microscopes, semiconductor manufacturing apparatuses, and inspection apparatuses.

Advantageous Effects of Invention

According to the present disclosure, a method for efficiently manufacturing a fine electron source is provided. Further, according to the present disclosure, an electron source that can meet the demands for miniaturization and a device including the same are provided.

BRIEF DESCRIPTION OF DRAWINGS (a) in FIG. 1 is a front view schematically showing a part of a configuration of an electron gun including an electron source according to the present disclosure, and (b) in FIG. 1 is an enlarged view of a distal end portion of the electron source.

FIG. 2 is a cross-sectional view of the distal end portion of the electron source shown in (b) in FIG. 1.

(a) and (b) in FIG. 3 are cross-sectional views schematically showing a state in which grooves are formed in a block of an electron-emitting material by an ion beam, and (c) in FIG. 3 is a top view schematically showing a state in which a chip is cut out from the block by forming four grooves.

(a) in FIG. 4 is a perspective view schematically showing a state in which the cut out chip is picked up by a probe, and (b) in FIG. 4 is a perspective view schematically showing a state in which the chip is cut after a part of the chip is temporarily fixed to a distal end surface of a support needle.

Figure 7:
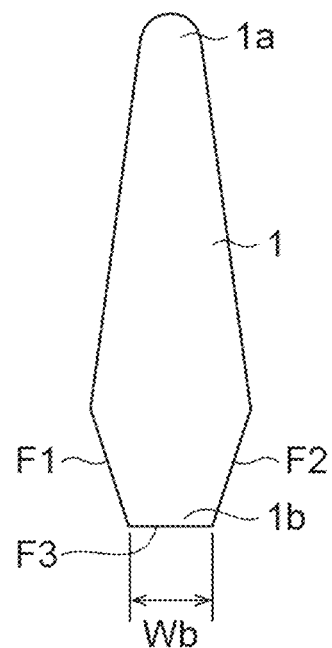
Figure 7:
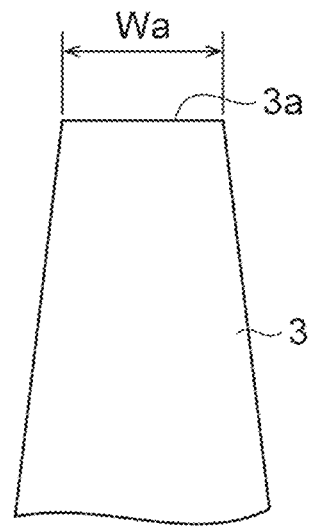

(a) in FIG. 7 is a side view schematically showing another aspect of the chip (after processing), and (b) in FIG. 7 is a side view schematically showing a distal end of the support needle.

Figure 8:
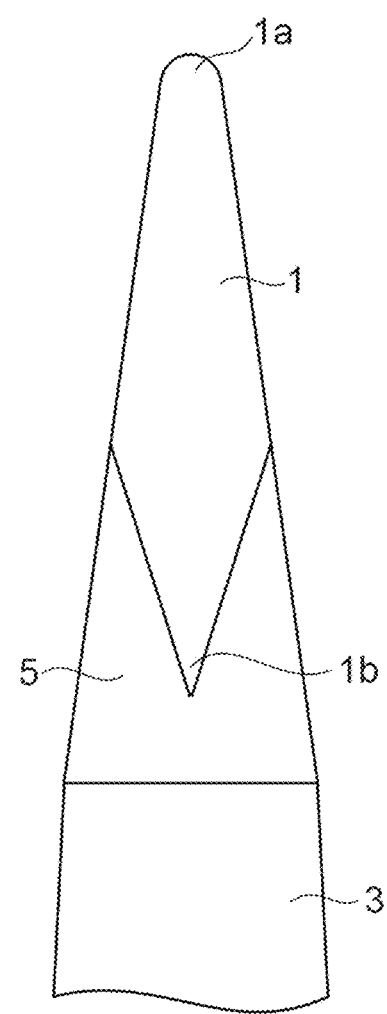

FIG. 8 is a side view schematically showing an aspect in which a material constituting a joint is interposed between the distal end of the support needle and a proximal end portion of the chip (after processing).

Figure 9:
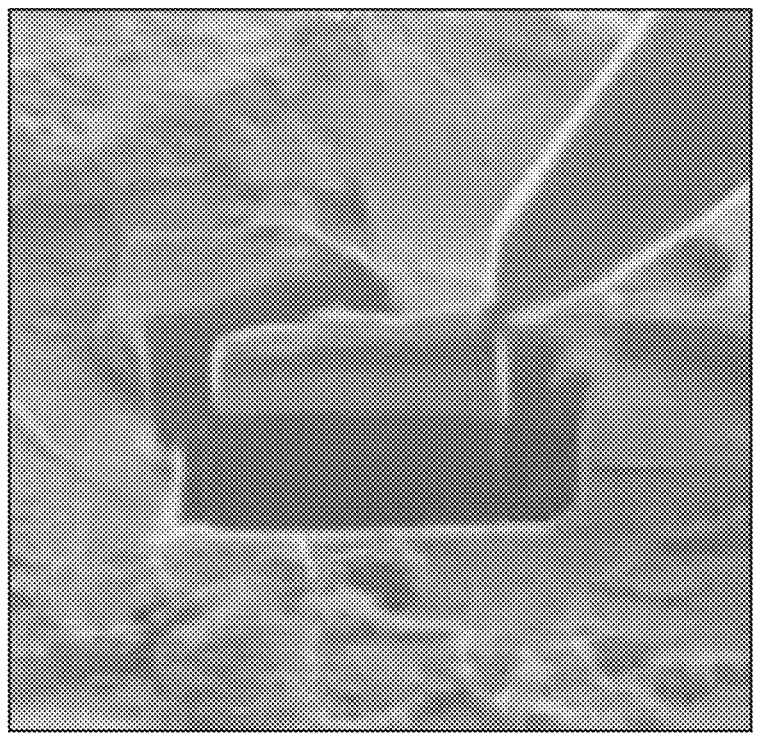
Figure 9:
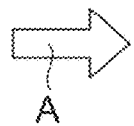
Figure 9:
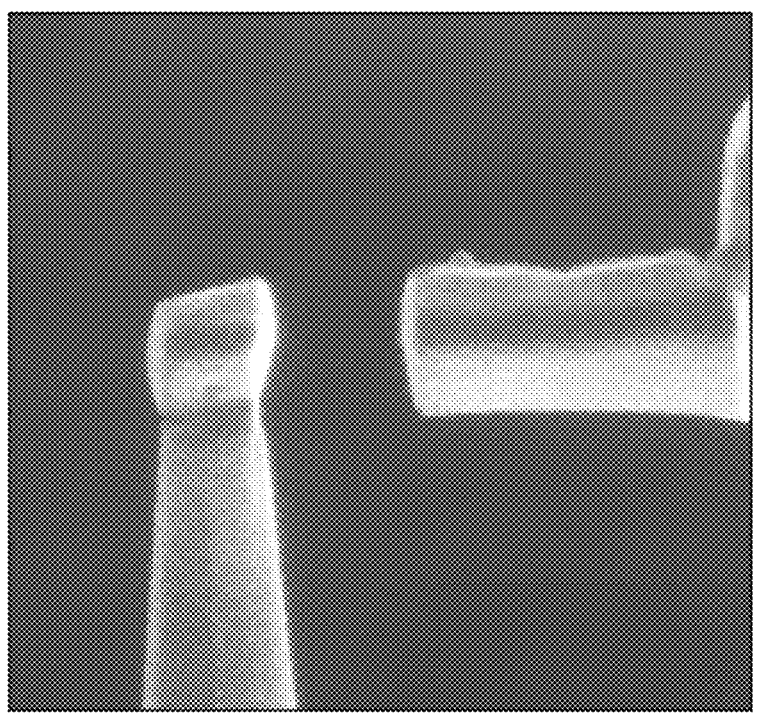

(a) and (b) in FIG. 9 are SEM photographs showing a process of manufacturing the electron source according to an example.

Figure 10:
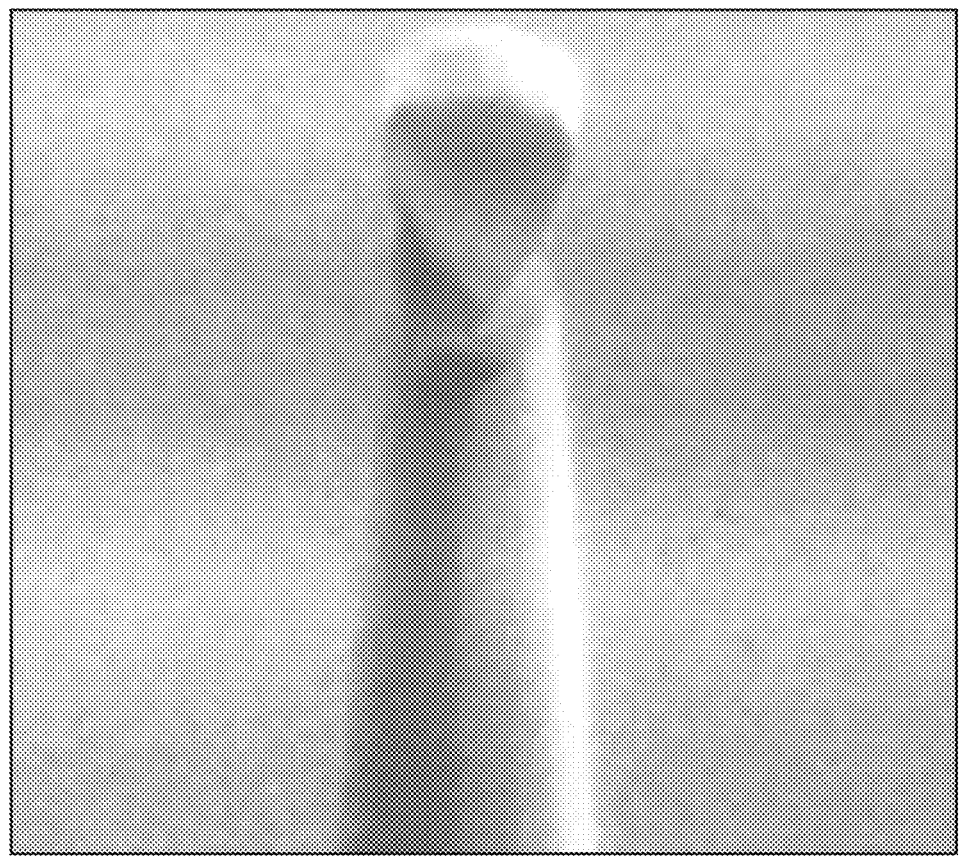

FIG. 10 is a SEM photograph of the chip captured in a direction of an arrow in (b) in FIG. 9.

Figure 11:
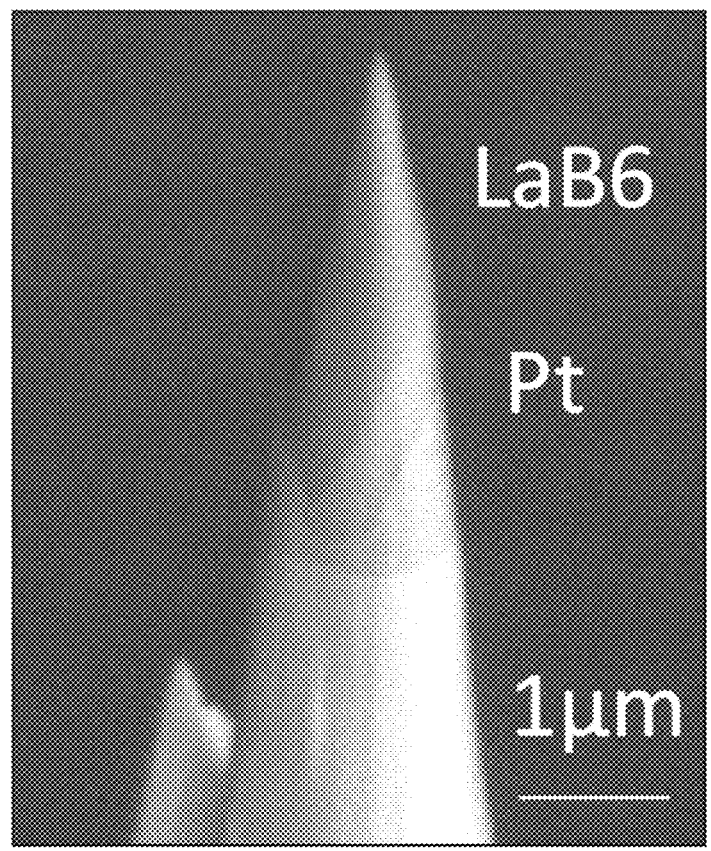

FIG. 11 is a SEM photograph showing the distal end portion of the electron source according to the example.

DESCRIPTION OF EMBODIMENTS

Embodiments of the present disclosure will be described below with reference to the drawings. In the following description, the same elements or elements having the same function will be denoted by the same reference numerals, and redundant description will be omitted. The present invention is not limited to the following embodiments.

<Electron Source>

Figure 1:
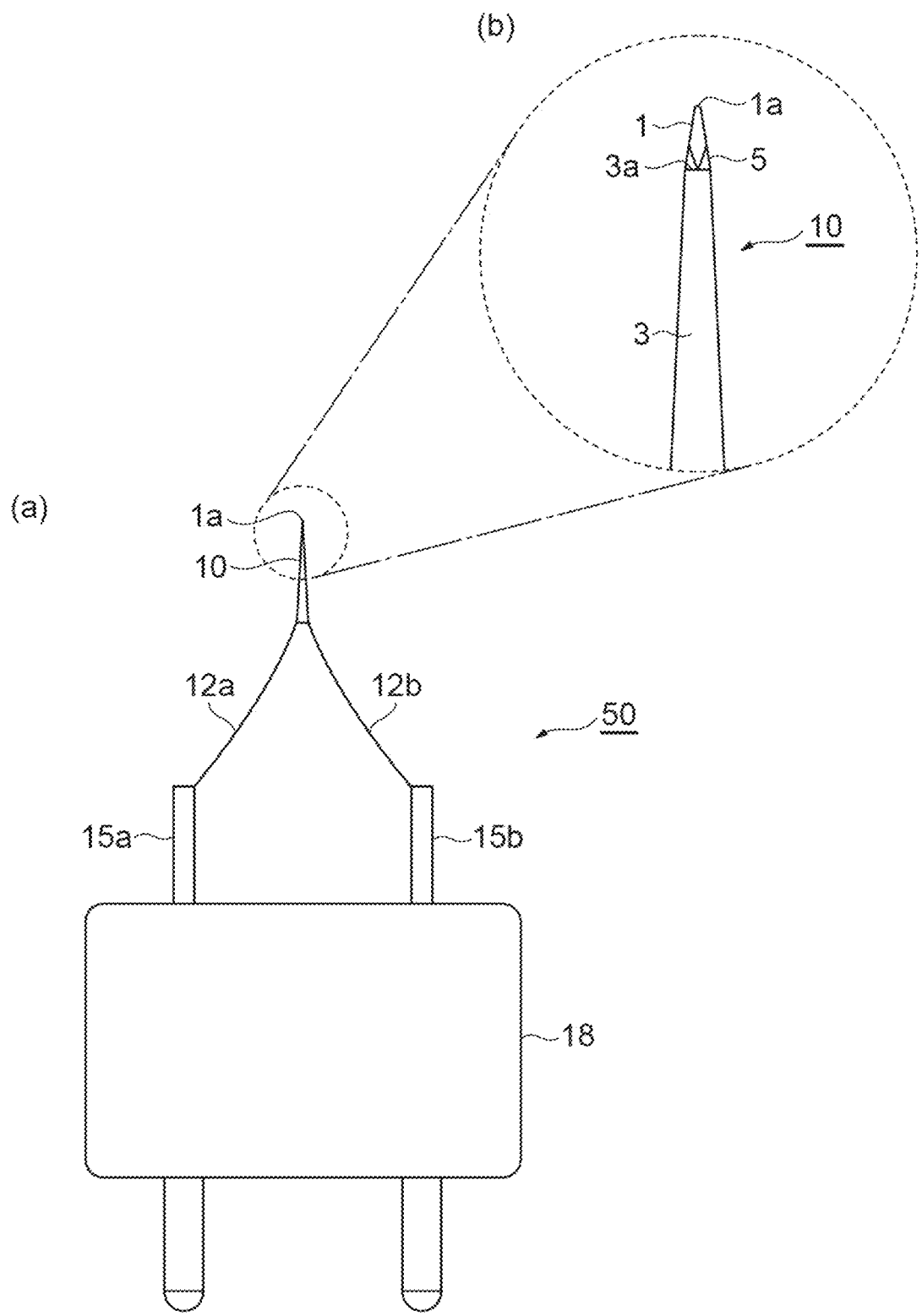

(a) in FIG. 1 is a front view schematically showing a part of a configuration of an electron gun including an electron source according to this embodiment, and (b) in FIG. 1 is an enlarged view of a distal end portion of the electron source. The electron gun 50 shown in (a) in FIG. 1 is called a thermal field emission type. The electron gun 50 includes an electron source 10, filaments 12a and 12b, electrodes 15a and 15b, and an insulator 18. The electron source 10 is heated by energizing the filaments 12a and 12b, and electrons are emitted from a distal end portion of the electron source 10. Examples of devices including the electron source 10 include electron microscopes, semiconductor manufacturing apparatuses, inspection apparatuses and processing apparatuses.

As shown in (b) in FIG. 1, the electron source 10 is configured of a chip 1 made of an electron-emitting material, a support needle 3 that supports the chip 1, and a joint 5 that fixes the chip 1 to a distal end surface 3a of the support needle 3. The distal end portion of the electron source 10 is configured of a distal end portion 1a (a second end portion) of the chip 1.

Figure 2:
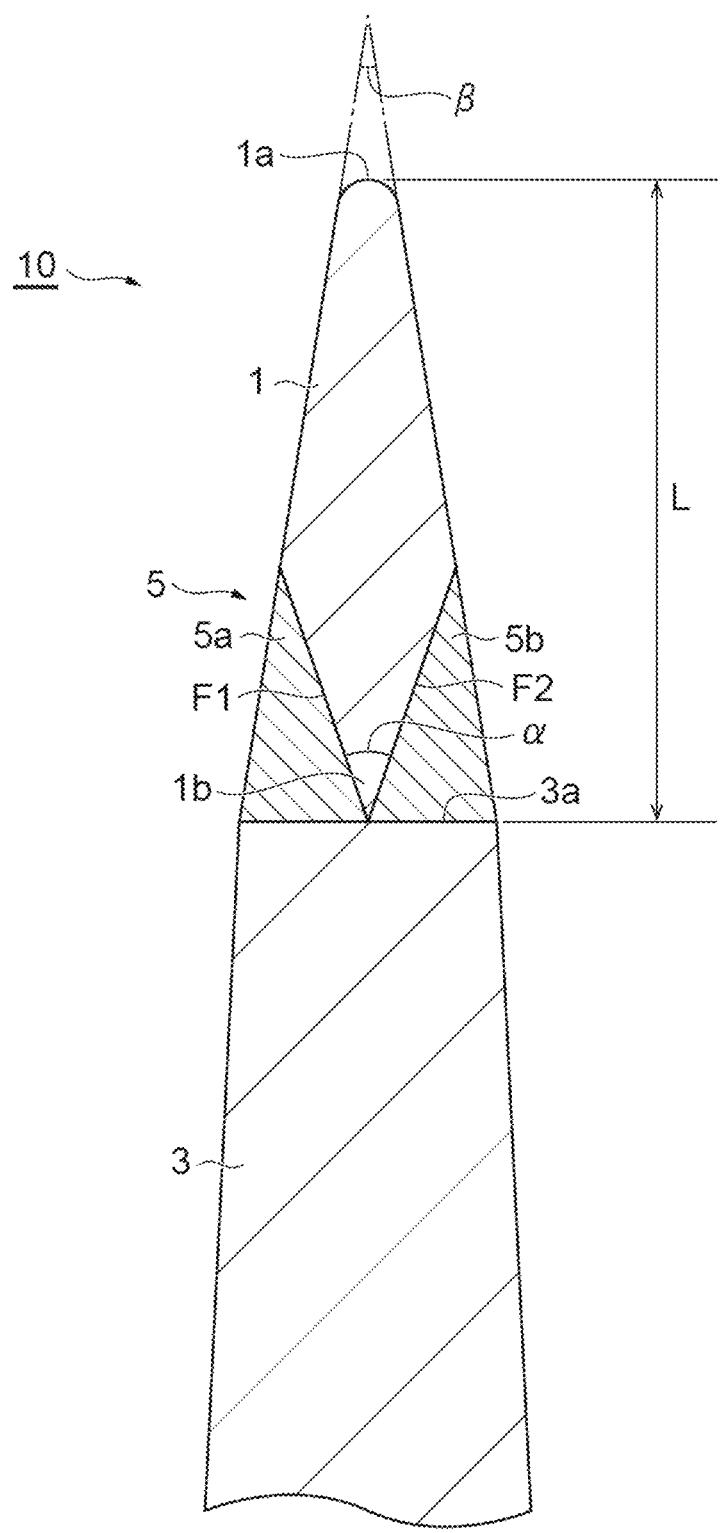

FIG. 2 is an enlarged cross-sectional view of the chip of the electron source 10. The chip 1 is fine and has a length (a length L in FIG. 2) of, for example, 2 to 3 µm. The chip 1 is made of an electron-emitting material. The electron-emitting material is a material that emits electrons when heated. Examples of the electron-emitting material include rare earth borides such as lanthanum boride ($LaB_6$) and cerium boride ($CeB_6$); high melting point metals such as tungsten, tantalum, and hafnium, and oxides, carbides, and nitrides thereof.

As shown in FIG. 2, a proximal end portion 1b (a first end portion) of the chip 1 is configured of a first surface F1 and a second surface F2. The proximal end portion 1b faces the distal end surface 3a. In this embodiment, the proximal end portion 1b is in contact with the distal end surface 3a. An angle formed by the first surface F1 and the second surface F2 (an angle α in FIG. 2) is, for example, 10 to 90°, and is preferably 45 to 85° from the viewpoint of strong joining of the proximal end portion 1b to the distal end surface 3a. From the viewpoint of stable electron emission over a long period of time, an angle (an angle β in FIG. 2) of the distal end portion of the chip 1 in a longitudinal section is, for example, preferably 5 to 90°, and more preferably 10 to 30°.

The support needle 3 is also fine, and the distal end surface 3a thereof is, for example, circular with a diameter of 0.5 to 10 µm. This diameter may be 0.5 to 8 µm or 0.6 to 2 µm. The support needle 3 is made of a material that has electrical conductivity and excellent heat resistance. Examples of a material constituting the support needle 3 include tungsten, tantalum, platinum, rhenium, and carbon. The distal end surface 3a of the support needle 3 does not necessarily have to be circular, and may be, for example, an ellipse or a quadrilateral with rounded four corners. In these shapes, the distal end surface has a width of, for example, 0.5 to 10 µm.

The joint 5 is made of bonding materials 5a and 5b, and is formed between the distal end surface 3a of the support needle 3 and the proximal end portion 1b side of the chip 1. That is, a region defined by the first surface F1 and the distal end surface 3a is filled with the bonding material 5a, and a region defined by the second surface F2 and the distal end surface 3a is filled with the bonding material 5b. The bonding materials 5a and 5b are respectively filled into the regions by, for example, vapor deposition or sputtering. Specific examples of the bonding materials 5a and 5b include platinum, tungsten, carbon, and gold.

<Method for Manufacturing Electron Source>

Figure 3:
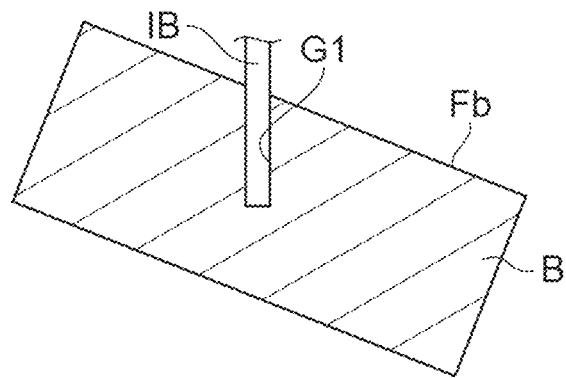
Figure 3:
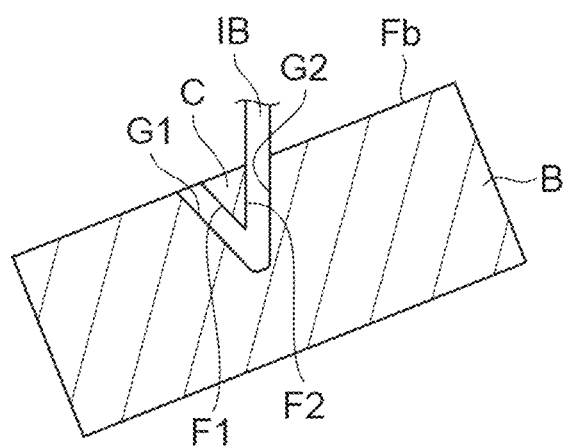
Figure 3:
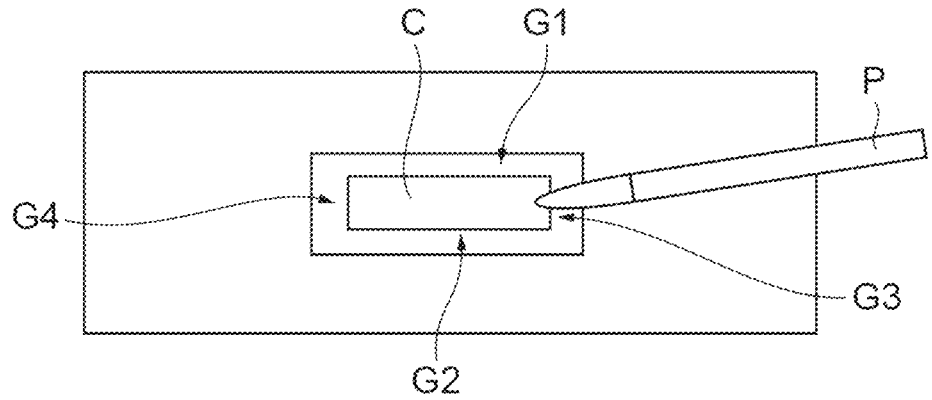
Figure 4:
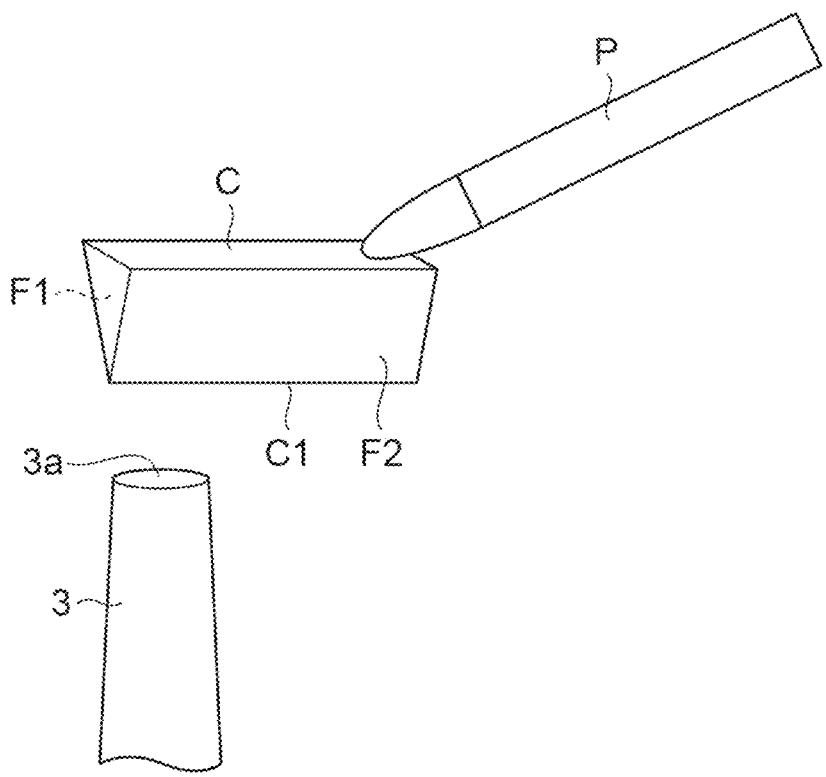
Figure 4:
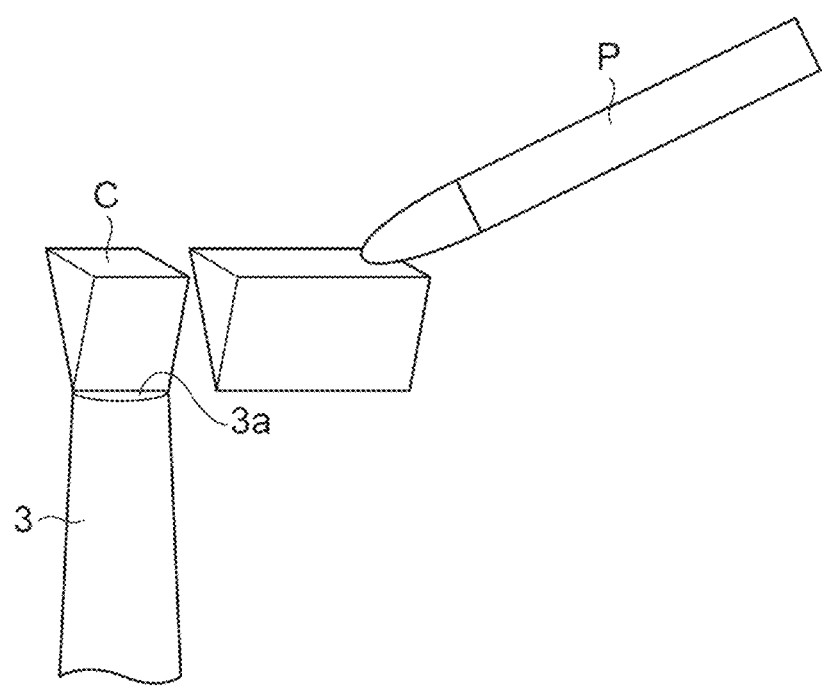
Figure 5:
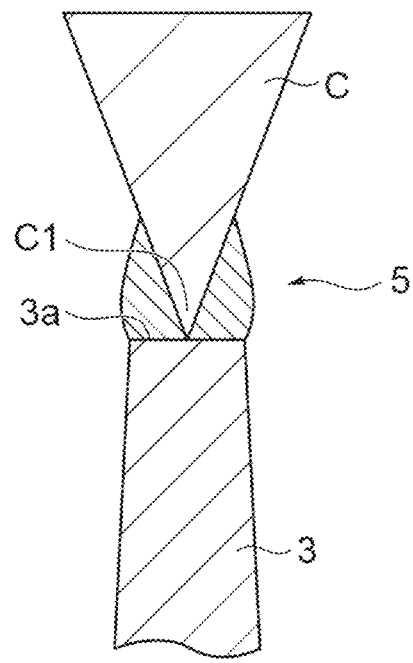
FIG. 5 is a cross-sectional view schematically showing a state in which a proximal end portion of the chip is joined to the distal end surface of the support needle using a metal material.
Figure 6:
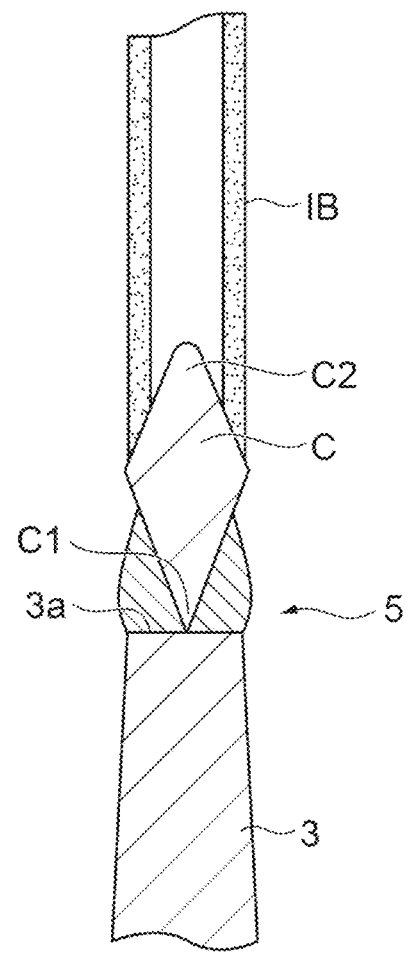
FIG. 6 is a cross-sectional view schematically showing a state in which the distal end portion of the chip is sharpened by an ion beam having a cross section formed in a doughnut shape.

Next, a method for manufacturing the electron source 10 will be described. The method for manufacturing the electron source 10 includes the following steps of:

(A) cutting out a chip C of an electron-emitting material from a block B of the electron-emitting material (refer to (a) to (c) in FIG. 3);

(B) fixing the chip C to the distal end surface 3a of the support needle 3 (refer to (a) and (b) in FIG. 4, and FIG. 5); and (C) sharpening a distal end portion of the chip C on the distal end surface 3a of the support needle 3 (refer to FIG. 6).

[Step (A)]

Step (A) includes the following steps of:

(a1) forming a first groove G1 constituting the first surface F1 of the chip C in the block B by irradiating a surface Fb of the block B with an ion beam IB (refer to (a) in FIG. 3); and (a2) forming a second groove G2 constituting the second surface F2 of the chip C in the block B by irradiating the surface Fb of the block B with the ion beam IB (refer to (b) in FIG. 3).

The first groove G1 and the second groove G2 can be formed, for example, by irradiation with a focused ion beam (FIB). After the first groove G1 is formed, an angle of the block B may be changed to form the second groove G2. The chip C is cut out of the block B through a step of forming grooves G3 and G4 constituting side surfaces of the chip C by the irradiation with the FIB. Then, a probe P is bonded to the vicinity of one end portion of the chip C. This bonding can be performed, for example, by vapor deposition of a metal such as platinum. Thus, it becomes possible to pick up the chip C with the probe P (refer to (c) in FIG. 3 and (a) in FIG. 4).

[Step (B)]

As shown in (a) in FIG. 4, the chip C is transported above the distal end surface 3a of the support needle 3 prepared separately. The first end portion C1 of the chip C is temporarily fixed to the distal end surface 3a. In this embodiment, the first end portion C1 includes the first surface F1 and the second surface F2. The chip C can be temporarily fixed by, for example, vapor deposition of a metal such as platinum. Then, the chip C is cut according to a size of the distal end surface 3a (refer to (b) in FIG. 4). Cutting of the chip C can be performed by the FIB. Then, as shown in FIG. 5, a joint 5 is formed in a region including an interface between the distal end surface 3a and the first end portion C1 of the chip C. The joint 5 can be formed by vapor deposition or sputtering.

[Step (C)]

FIG. 6 is a cross-sectional view schematically showing a state in which the second end portion C2 side of the chip C on the distal end surface 3a is sharpened. This processing can be performed using an ion beam IB having a donut-shaped cross section. After the processing using the ion beam IB, the chip 1 shown in FIG. 2 is obtained from the chip C shown in FIG. 5. The joint portion 5 may be processed by the ion beam IB so that an outer surface of the joint 5 is continuous with an outer surface of the chip 1 and an outer surface of the support needle 3.

Although the embodiments of the present disclosure have been described in detail above, the present invention is not limited to the above embodiment. For example, in the above embodiment, the electron source applied to a thermal field emission type electron gun has been described, but the electron source applied to the field emission type electron gun may be manufactured by the method of the above embodiment.

In the above embodiment, although the case in which the proximal end portion 1b of the chip 1 has a shape (a wedge shape) constituted of the first surface F1 and the second surface F2 has been exemplified, as shown in (a) in FIG. 7, the proximal end portion 1b of the chip 1 may further include a distal end surface F3. In this case, a width (a width Wb in (a) in FIG. 7) of the proximal end portion of the chip is preferably 0.5 μm or less, and more preferably 0.1 to 0.2 μm. Further, in the above embodiment, although the case in which the support needle 3 has the distal end surface 3a is exemplified, the distal end of the support needle 3 may be sharpened. Even when the distal end of the support needle 3 is sharpened, the chip C can be fixed by, for example, vapor deposition. It is preferable that a width Wa of the distal end of the support needle 3 (a width Wa in (b) in FIG. 7) and the width Wb of the proximal end portion 1b of the chip 1 satisfy one of Condition 1 and Condition 2 expressed by the following inequalities.

$$1 \leq Wa/Wb \leq 10000 \quad \text{(Condition 1)}$$

$$1 \leq Wb/Wa \leq 10000 \quad \text{(Condition 2)}$$

Regarding Condition 1, a value of Wa/Wb is more preferably 1000 to 10000. Regarding Condition 2, a value of Wb/Wa is more preferably 1000 to 10000.

In the above embodiment, although the case in which the proximal end portion 1b of the chip 1 is in contact with the distal end surface 3a of the support needle 3 has been exemplified, the distal end of the support needle 3 and the proximal end portion 1b of the chip 1 may be spaced apart from each other, and a material constituting the joint 5 may be interposed therebetween (refer to FIG. 8).

This disclosure is as follows.

[1] A method for manufacturing an electron source including:
(A) cutting out a chip of an electron emitting material from a block of the electron emitting material;
(B) fixing a first end portion of the chip to a distal end of a support needle; and
(C) sharpening a second end portion of the chip fixed to the distal end, wherein
the step (A) includes:
(a1) forming a first groove constituting a first surface of the chip in the block by irradiating a surface of the block with an ion beam; and
(a2) forming a second groove constituting a second surface of the chip in the block by irradiating the surface of the block with an ion beam,
the first end portion of the chip has the first surface and the second surface forming an angle of 10 to 90°, and
the step (B) includes forming a joint between the distal end of the support needle and the first end portion of the chip.

[2] An electron source includes:
a support needle having a distal end;
a chip of an electron emitting material having first and second end portions;
a joint configured to fix the first end portion of the chip to the distal end of the support needle,
wherein the first end portion of the chip has a first surface and a second surface forming an angle of 10 to 90°.

[3] The electron source according to [2], wherein the first end portion of the chip is in contact with the distal end of the support needle.

[4] The electron source according to [2] or [3], wherein a width Wa of the distal end of the support needle and a width Wb of the first end portion of the chip satisfy one of Condition 1 and Condition 2 expressed by following inequalities:

$$1 \leq Wa/Wb \leq 10000 \quad \text{(Condition 1)}$$

$$1 \leq Wb/Wa \leq 10000. \quad \text{(Condition 2)}$$

[5] The electron source according to any one of [2] to [4], wherein a width of the distal end of the support needle is 0.5 to 10 μm, and a width of the first end portion of the chip is 0.5 μm or less.

[6] The electron source according to any one of [2] to [5], wherein, in a longitudinal section, the second end portion of the chip has an angle of 5 to 90°.

[7] A device including the electron source according to any one of [2] to [6].

EXAMPLES

Hereinafter, the present disclosure will be described based on examples. The present invention is not limited to the following examples.

Examples

A block of LaB$_6$ (an electron emitting material) and a support needle made of tungsten were prepared with the following sizes.

<Block of LaB$_6$>
  Diameter: approximately 6 mm
  Thickness: approximately 1 mm
<Support Needle>
  Diameter of distal end surface: Approximately 1 µm
  A chip was cut out from the block of LaB$_6$ using an FIB processing machine (refer to (a) in FIG. 9).
  Width of chip: approximately 15 µm
  Height of chip: approximately 5 µm
  Angle between the first surface and the second surface: approximately 60°

While the chip was held by the probe made of tungsten, the chip was temporarily fixed to the distal end surface of the support needle via platinum. Then, the chip was cut by FIB according to the size of the distal end surface of the support needle (refer to (b) in FIG. 9). FIG. 10 is a SEM photograph of the chip captured in a direction of an arrow A in (b) in FIG. 9.

A joint was formed by depositing platinum on a region including an interface between the proximal end of the chip and the distal end surface of the support needle. Platinum deposition was performed using FIB. Then, using an FIB processing machine, the distal end of the chip was sharpened by radiating an ion beam with a doughnut-shaped cross section from above the chip (refer to FIG. 6). Through these steps, an electron source having the distal end shown in FIG. 11 was manufactured. An angle β of the distal end was 14.9°.

REFERENCE SIGNS LIST

1: Chip, 1a: Distal end (second end portion), 1b: Proximal end (first end portion), 3: Support needle, 3a: Distal end surface, 5: Joint, 5a, 5b: Bonding material, 10: Electron source, 12a, 12b: Filament, 15a, 15b: Electrode, 18: Insulator, 50: Electron gun, B: Block, C: Chip, C1: First end portion, C2: Second end portion, F1: First surface, F2: Second surface, F3: Distal end surface, Fb: Surface of block, G1: First groove, G2: Second groove, G3, G4: Groove, IB: Ion beam, P: Probe

The invention claimed is:

1. A method for manufacturing an electron source, the electron source comprising:
a support needle having a distal end;
a chip of an electron emitting material having first and second end portions; and
a joint configured to fix the first end portion of the chip to the distal end of the support needle,
wherein the first end portion of the chip has a first surface and a second surface which form an angle of 10 to 90°, the method comprising steps of:
(A) cutting out a chip of an electron emitting material from a block of the electron emitting material;
(B) fixing a first end portion of the chip to a distal end of a support needle; and
(C) sharpening a second end portion of the chip fixed to the distal end, wherein the step (A) includes:
(a1) forming a first groove constituting a first surface of the chip in the block by irradiating a surface of the block with an ion beam; and
(a2) forming a second groove constituting a second surface of the chip in the block by irradiating the surface of the block with an ion beam,
the first end portion of the chip has the first surface and the second surface forming an angle of 10 to 90°, wherein the first surface and the second surface are formed such that the distance between the first surface and the second surface becomes closer as it goes from the second end portion of the chip towards the first end portion; and
the step (B) includes forming a joint between the distal end of the support needle and the first end portion of the chip.

2. An electron source comprising:
a support needle having a distal end;
a chip of an electron emitting material having first and second end portions; and
a joint configured to fix the first end portion of the chip to the distal end of the support needle,
wherein the first end portion of the chip has a first surface and a second surface which form an angle of 10 to 90°, wherein the first surface and the second surface have been formed such that the distance between the first surface and the second surface becomes closer as it goes from the second end portion of the chip towards the first end portion.

3. The electron source according to claim 2, wherein the first end portion of the chip is in contact with the distal end of the support needle.

4. The electron source according to claim 2, wherein a width Wa of the distal end of the support needle and a width Wb of the first end portion of the chip satisfy one of Condition 1 and Condition 2 expressed by following inequalities:

$$1 \leq Wa/Wb \leq 10000 \quad \text{(Condition 1)}$$

$$1 \leq Wb/Wa \leq 10000. \quad \text{(Condition 2)}$$

5. The electron source according to claim 2, wherein a width of the distal end of the support needle is 0.5 to 10 µm, and a width of the first end portion of the chip is 0.5 µm or less.

6. The electron source according to claim 2, wherein, in a longitudinal section, the second end portion of the chip has an angle of 5 to 90°.

7. A device including the electron source according to claim 2.

8. The method according to claim 1, wherein the first end portion of the chip has a wedge shape constituted of the first surface and the second surface.

9. The electron source according to claim 2, wherein the first end portion of the chip has a wedge shape constituted of the first surface and the second surface.

* * * * *